(12) United States Patent
Arai et al.

(10) Patent No.: US 6,187,457 B1
(45) Date of Patent: Feb. 13, 2001

(54) ORGANIC EL ELEMENT AND METHOD OF PRODUCING THE SAME

(75) Inventors: Michio Arai, Tokyo; Kenji Nakaya, Chiba; Osamu Onitsuka, Chiba; Masami Mori, Chiba, all of (JP)

(73) Assignee: TDK Corporation, Tokyo (JP)

( * ) Notice: Under 35 U.S.C. 154(b), the term of this patent shall be extended for 0 days.

(21) Appl. No.: 09/117,043

(22) PCT Filed: Nov. 26, 1997

(86) PCT No.: PCT/JP97/04311

§ 371 Date: Oct. 21, 1998

§ 102(e) Date: Oct. 21, 1998

(87) PCT Pub. No.: WO98/24273

PCT Pub. Date: Jun. 4, 1998

(30) Foreign Application Priority Data

Nov. 27, 1996 (JP) .................................................. 8-331632

(51) Int. Cl.⁷ ..................................................... H05B 33/14
(52) U.S. Cl. ...................... 428/690; 428/469; 428/472.1; 257/100
(58) Field of Search ................................. 428/690, 917, 428/469, 472.1; 257/100

(56) References Cited

U.S. PATENT DOCUMENTS

| | | |
|---|---|---|
| 4,885,211 | 12/1989 | Tang et al. . |
| 5,059,861 | 10/1991 | Littman et al. . |
| 5,652,067 * | 7/1997 | Ito et al. ............................ 428/690 |
| 5,776,622 * | 7/1998 | Hung et al. ......................... 428/690 |

* cited by examiner

Primary Examiner—William Krynski
Assistant Examiner—Dawn L. Garrett
(74) Attorney, Agent, or Firm—Oblon, Spivak, McClelland, Maier & Neustadt, P.C.

(57) ABSTRACT

The invention provides an organic electroluminescent light emitting device comprising essentially comprising a substrate, a hole injecting electrode formed on at least said substrate, a light emitting layer and an electron injecting electrode containing a constituting material having a work function of up to 4 eV. The electron injecting electrode has a sealing film on a side thereof not opposite to the substrate. This sealing film contains one or two or more of an oxide, a nitride and a carbide of the constituting material for the electron injecting electrode, and so can be relatively easily formed continuously from the electron injecting electrode without any dedicated equipment for sealing films, while maintaining a high sealing effect. The invention also provides a process of producing such an organic electroluminescent light emitting device.

4 Claims, 1 Drawing Sheet

US 6,187,457 B1

ORGANIC EL ELEMENT AND METHOD OF PRODUCING THE SAME

TECHNICAL FIELD

The present invention relates generally to an organic electroluminescent light emitting device (which will hereinafter be often called an organic EL device for short) using an organic compound, and more particularly to an organic EL device in which an electron injecting electrode for supplying electrons to a light emitting layer is provided thereon with a sealing film, and its production process.

BACKGROUND TECHNIQUE

In recent years, organic EL devices have been under intensive investigation. One such organic EL device basically includes a transparent electrode (a hole injecting electrode) of tin-doped indium oxide (ITO). A thin film is formed on the transparent electrode by evaporating a hole transporting material such as triphenyldiamine (TPD). A light emitting layer of a fluorescent material such as an aluminum quinolinol complex ($Alq^3$) is deposited on the hole transporting thin film. An electrode (an electron injecting electrode) is formed thereon from a metal having a low work function such as magnesium or Mg. This organic EL device attracts attentions because they can achieve a very high luminance ranging from several hundreds to tens of thousands $cd/m^2$ with a voltage of approximately 10 volts.

An electron injecting electrode considered to be effective for such organic EL devices is made up of a material capable of injecting more electrons into the light emitting layer or electron injecting and transporting layer. In other words, the lower the work function of a material, the more suitable is the material as the electron injecting electrode. Various materials having a low work function are available. Regarding materials used as the electron injecting electrode of organic EL devices, for instance, JP-A 2-15595 discloses an electron injecting electrode comprising a plurality of metals other than an alkali metal, at least one of which has a work function of less than 4 eV, typically MgAg.

A preferable material having a low work function is an alkali metal. U.S. Pat. Nos. 3,173,050 and 3,382,394 disclose NaK as one example of the alkali metal. However, an electron injecting electrode made up of the alkali metal is inferior to that built up of MgAg, etc. in terms of safety and reliability, because the alkali metal has high activity and so is chemically unstable.

To use such a material having a low work function as mentioned above or its alloy, film sealing has been under investigation. To achieve sufficient sealing, however, it is required to make use of costly yet troublesome sealing films such as those of Teflon or $SiO_2$ because any desired result is unachievable by use of glass sealing or the like. Such film sealing should be carried out immediately after the formation of an electron injecting electrode, thereby preventing corrosion of the electron injecting electrode by oxidation. To this end, however, dedicated film sealing equipment should be provided separately.

In efforts to prevent oxidation, it has been proposed to form an aluminum cap layer on Mg.Al as set forth in JP-A 4-233194 or to use a cap layer formed of an alkaline earth metal, a rare earth metal or the like which have a work function much lower than that of the electron injecting electrode material. However, such cap layers have for its object the prevention of appearance of dark spots, and so serve mainly to absorb moisture at an interface between a cathode (electron injecting electrode) and an organic electroluminescent medium, etc. In other words, these cap layers are less than satisfactory for a sealing film protecting the whole of an organic EL device.

DISCLOSURE OF THE INVENTION

It is therefore an object of the invention to provide an organic EL device including a sealing film which can be relatively easily formed continuously from an electron injecting electrode without recourse to any dedicated equipment for sealing films, and has a high sealing effect as well. Another object of the invention is to provide a process of producing such an organic EL device.

Such objects are achievable by the inventions defined below as (1) to (6).

(1) An organic EL device at least comprising a substrate and a hole injecting electrode, a light emitting layer and an electron injecting electrode containing a constituting material having a work function of up to 4 eV formed on said substrate, wherein:

said electron injecting electrode has a sealing film on a side thereof opposite to said substrate, said sealing film containing one or two or more of an oxide, a nitride and a carbide of a constituting material for said electron injecting electrode.

(2) The organic EL device of (1), wherein said sealing film contains oxygen, nitrogen and carbon in amounts of 1 to 60 at % calculated as 0, 1 to 30 at % calculated as N and 1 to 20 at % calculated as C, respectively.

(3) An organic EL device comprising at least a substrate and a hole injecting electrode, a light emitting layer and an electron injecting electrode containing a constituting material having a work function of up to 4 eV formed on said substrate, wherein:

said electron injecting electrode has an auxiliary electrode thereon, said auxiliary electrode having a sealing film on a side thereof opposite to said substrate, and said sealing film containing one or two or more of an oxide, a nitride and a carbide of a constituting material for said auxiliary electrode.

(4) The organic EL device of (3), wherein said sealing film contains oxygen, nitrogen and carbon in amounts of 1 to 60 at % calculated as 0, 1 to 30 at % calculated as N and 1 to 20 at % calculated as C, respectively.

(5) A process of producing an organic EL device, which comprise steps of forming an electron injecting electrode having a work function of up to 4 eV by a sputtering technique, and then sputtering a constituting material for said electron injecting electrode while a gas containing one or two or more of oxygen, nitrogen and carbon is introduced as a reactive gas to form a sealing film, so that an organic EL device as recited in any one of (1) to (4) is obtained.

(6) A process of producing an organic EL device, which comprises steps of:

forming an electron injecting electrode containing a constituting material having a work function of up to 4 eV by a sputtering technique, forming an auxiliary electrode by a sputtering technique after formation of said electron injecting electrode, and sputtering a constituting material for said auxiliary electrode while a gas containing one or two or more of oxygen, nitrogen and carbon is introduced as a reactive gas to form a sealing film.

BEST MODE FOR CARRYING OUT THE INVENTION

Figure 1:
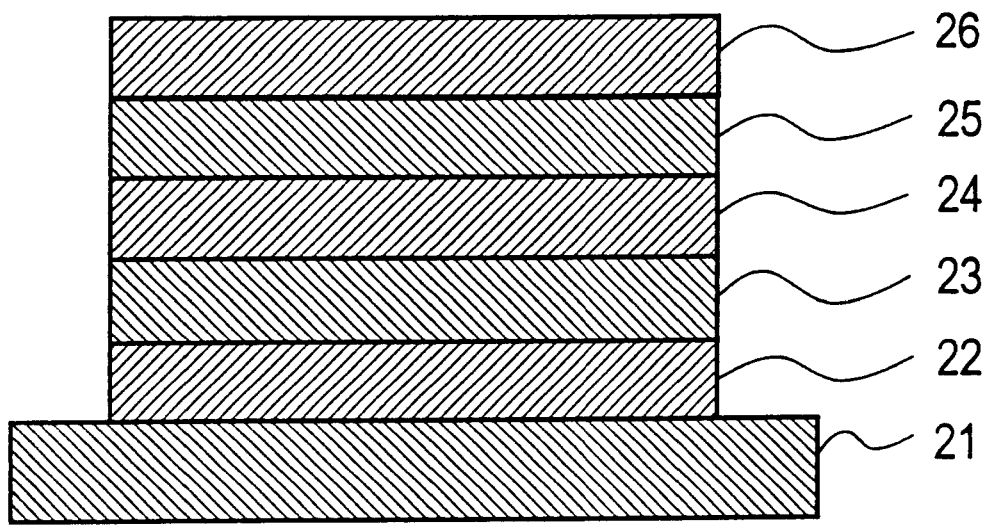
FIG. 1 is a schematic representation of one embodiment of the organic EL device of the invention.

Some preferred embodiments of the invention will now be explained at great length.

The organic EL device according to the invention comprises a hole injecting electrode or an anode formed on at least a substrate, a light emitting layer and an electron injecting electrode or a cathode containing a constituting material having a work function of up to 4 eV, and further includes a sealing film formed on a side of the electron injecting electrode that is opposite to the substrate, said sealing film containing at least one of an oxide, a nitride or a carbide of a material that constitutes the electron injecting electrode.

The electron injecting electrode according to the invention is made up of a metal having a work function of up to 4 eV or its alloy or intermetallic compound. With the work function of the material exceeding 4 eV, the electron injection efficiency drops with a decrease in the light emission efficiency. Metals constituting an electron injecting electrode film and having a work function of up to 4 eV, for instance, include alkali metals such as lithium or Li, sodium or Na and potassium or K, alkaline earth metals such as magnesium or Mg, calcium or Ca, strontium or Sr and barium or Ba, rare earth metals such as lanthanum or La and cerium or Ce, aluminum or Al, indium or In, silver or Ag, tin or Sn, zinc or Zn, and zirconium or Zr. Electron injecting electrode-constituting alloys containing metals having a work function of up to 4 eV, for instance, include Ag.Mg (Ag: 1 to 20 at %), Al.Li (Li: 0.5 to 12 at %), In.Mg (Mg: 50 to 80 at %) and Al.Ca (Ca: 5 to 20 at %). These may be used alone or in combination of two or more. When such metals or alloys are used in combination of two or more, they may be mixed at any desired rate.

This electron injecting electrode may be formed by evaporation or other techniques. However, it is preferable to use a sputtering technique, especially a DC sputtering process. Power for operating a DC sputtering system is in the range of preferably 0.1 to 10 W/cm$^2$, and especially 0.5 to 7 W/cm$^2$. A film forming rate is in the range of preferably 0.1 to 100 nm/min., and especially 1 to 30 nm/min.

Preferably but not exclusively, inert gases such as argon or Ar, helium or He, neon or Ne, krypton or Kr and xenon or Xe are employed as a sputtering gas, and they may be used alone or in admixture at a pressure of usually about 0.1 Pa to 20 Pa.

Such an electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

The organic EL device of the invention may have an auxiliary electrode on the side of the electron injecting electrode that is not opposite to the organic layers. This auxiliary electrode may be used, for instance, when the film resistance of the electron injecting electrode is high or when the electron injecting electrode has such a thickness as to perform a minimum electron injecting function. Alternatively, the auxiliary electrode may be used as a simple matrix of interconnecting electrode to reduce a voltage drop and prevent luminance variations. Furthermore, when the auxiliary electrode is applied to an active matrix type display using a TFT or the like, fast operation is achievable.

When the electron injecting electrode has a film resistance of at least 0.2 Ω/□, and especially at least 0.5 Ω/□, it is usually preferable to provide the auxiliary electrode thereon although depending on display size or auxiliary electrode material. The upper limit on film resistance is usually of the order of several hundreds Ω/□ although not critical. When the electron injecting electrode has a thickness of up to 300 nm and especially up to 200 nm, too, it is usually required to provide the auxiliary electrode thereon although depending on display size or auxiliary electrode material.

When the auxiliary electrode is allowed to function as an interconnecting electrode, its specific resistance is preferably up to 500 μΩ.cm, more preferably up to 50 μΩ.cm and especially up to 30 μΩ.cm, and most preferably up to 10 μΩ.cm. The lower limit on the specific resistance is about 3 μΩ.cm to about 4 μΩ.cm that is the specific resistance of aluminum although not critical. Aluminum, or alloys of aluminum and transition metals are preferably used as materials of which the auxiliary electrode having such a specific resistance is formed. In this case, the alloys of aluminum and transition metals have a transition metal content of preferably up to 5 at %, more preferably up to 2 at %, and especially up to 1 at %. However, it is most preferable to use aluminum alone. Preferably but not exclusively, an Al.Li alloy is used for the electron injecting electrode combined with the aluminum auxiliary electrode.

The auxiliary electrode may have a certain or larger thickness enough to make sure of electron injection efficiency and ensure prevention of penetration of moisture, oxygen or organic solvents, and so may have a thickness in the range of preferably at least 50 nm, more preferably at least 100 nm, and most preferably 100 to 1,000 nm. When the auxiliary electrode layer is too thin, no desired effect is obtained. In addition, the ability of the auxiliary electrode layer to cover steps becomes low, resulting in its poor connection with terminal electrodes. When the auxiliary electrode layer is too thick, on the other hand, the growth rate of dark spots becomes high due to the large stress of the auxiliary electrode. It is here to be noted that when the auxiliary electrode is allowed to function as an interconnecting electrode, its thickness is usually of the order of 100 to 500 nm so as to make up for the high film resistance of the electron injecting electrode due to its thinness, and that when the auxiliary electrode is allowed to function as other interconnecting electrode, its thickness is of the order of 100 to 300 nm.

For the sealing film in the organic EL device of the invention, use is made of one or two or more of the oxide, nitride and carbide of the constituting material for the electron injecting or auxiliary electrode, i.e., metals or alloys having a work function of up to 4 eV. In this case, it is to be noted that the sealing film-constituting material has usually the same composition as that of the electron injecting or auxiliary electrode material, although it may have somewhat different compositions or it may be free of one or more components of that material. In a particularly preferred embodiment of the invention where an Al.Li alloy is used for the electron injecting electrode, it is preferable to construct the sealing film of an oxide, nitride or carbide of aluminum that is one constituting component of the alloy.

Usually, such an oxide, nitride or carbide exists with their stoichiometric composition. However, the oxygen content of the oxide, the nitrogen content of the nitride, and the carbon content of the carbide may deviate more or less from this stoichiometric composition value, or they may be 0.5 to 2 times as large as the stoichiometric composition value. Preferably, the content of oxygen in the sealing film is in the range of 1 to 60 at % and especially 10 to 30 at %. Likewise, the content of nitrogen is in the range of preferably 1 to 30 at % and especially 5 to 10 at %, and the content of carbon is in the range of preferably 1 to 20 at % and especially 5 to 10 at %. These oxide, nitride and carbide may exist alone or in combination of two or more. The sum of C+N+0 is preferably in the range of especially 1 to 60 at %, and more especially 5 to 30 at %. It is here to be noted that the nitrogen or carbon may have a so-called gradient structure where there is a high concentration on one side. It is also to be noted that although depending on the type of the reactive gas used, hydrogen is often incorporated in the sealing film. The concentration of hydrogen in the sealing film is then preferably up to 1 at % and more preferably up to 0.3 at %, calculated as H. The presence of these oxides may be confirmed as by SIMS.

Such a sealing film may have a certain or larger thickness enough to ensure prevention of penetration of moisture, oxygen or organic solvents, and so may have a thickness in the range of preferably at least 5 nm, more preferably 5 to 200 nm, and especially 10 to 100 nm.

The total thickness of the electron injecting electrode plus the auxiliary electrode and sealing film, if required, is usually of the order of 100 to 1,000 nm although not particularly limited thereto.

This sealing film is formed by a reactive sputtering process. By use of the reactive sputtering process it is possible to provide continuous formation of the sealing film and the electron injecting electrode or auxiliary electrode. Preferably, the same material as the electron injecting electrode material is used for the target; $O_2$, $CO_2$ or the like is used as the reactive gas for oxide formation, $N_2$, $NH_3$, NO, $NO_2$, $N_2O$ or the like is used as the reactive gas for nitride formation, and $CH_4$, $C_2H_2$, $C_2H_4$ or the like is used as the reactive gas for carbide formation. These reactive gases may be used alone or in combination of two or more.

Preferred for sputtering is a DC sputtering system. Preferably but not exclusively, inert gases such as Ar, He, Ne, Kr and Xe or their mixed gases are used as the sputtering gas. Such sputtering gases and reactive gases are used at a flow rate of preferably 1 to 20 sccm, more preferably 1 to 10 sccm and especially 2 to 5 sccm during sputtering. Other sputtering conditions are the same as in the case of the aforesaid electron injecting electrode.

The organic EL device produced according to the invention comprises a substrate, a hole injecting electrode formed on the substrate and an electron injecting electrode formed thereon, and further includes at least one electron transporting layer and at least one light emitting layer between these electrodes as well as a protective layer in the form of the uppermost layer. In this regard, it is to be noted that the hole transporting layer may be dispensed with.

A representative embodiment of the organic EL device produced according to the invention is shown in FIG. 1. An organic EL device as shown in FIG. 1 comprises a substrate 21, and a hole injecting electrode 22, a hole injecting and transporting layer 23, a light emitting and electron injecting/transporting layer 24, an electron injecting electrode 25 and a sealing film 26 formed on the substrate in the described order. If required, such an auxiliary electrode as mentioned above may be provided on the electron injecting electrode 25.

The organic EL device of the invention is not limited to the structures illustrated, and so may have various structures. For instance, the light emitting layer may be provided in a single layer form and between this light emitting layer and the electron injecting electrode there may be interleaved an electron injecting and transporting layer. If required, the hole injecting and transporting layer may be mixed with the light emitting layer.

The electron injecting electrode and sealing film may be formed as mentioned above, the light emitting layer and other organic layers may be formed as by vacuum evaporation, and the hole injecting electrode may be formed as by evaporation or sputtering. If required, these films can be each patterned by mask evaporation or film formation followed by etching or the like, so that a desired light emitting pattern can be obtained. If the substrate is made up of thin film transistors (TFT), the respective films are then formed according to the TFT pattern for the immediate formation of a display or drive pattern.

Preferably, the material and thickness of the hole injecting electrode are determined in such a manner that at least 80% of light emission passes therethrough. More preferably, the hole injecting electrode is formed of a thin film form of transparent oxide electroconductor such as a film containing any one of tin-doped indium oxide (ITO), zinc-doped indium oxide (IZO), indium oxide ($In_2O_3$), tin oxide ($SnO_2$) and zinc oxide (ZnO) as a main component. These oxides may have a composition deviating slightly from their stoichiometric composition. Usually, ITO contains $In_2O_3$ and $SnO_2$ according to its stoichiometric composition; however, the content of oxygen may deviate slightly therefrom. Preferably, the mixing ratio of $SnO_2$ with respect to $In_2O_3$ is 1 to 20 wt % and especially 5 to 12 wt %, and the mixing ratio of $ZnO_2$ with respect to $In_2O_3$ is 12 to 32 wt %.

Preferably, the hole injecting electrode is formed by a sputtering technique. It is possible to use an RF sputtering process using an RF power source or the like as the sputtering technique. In view of ease with which the physical properties of the hole injecting electrode film formed is controlled, the smoothness of the surface of the film formed, etc., however, it is preferable to use a DC sputtering process.

Preferred among available DC sputtering systems is a magnetron DC sputtering system. Referring here to magnetic field strength, a magnetic flux density B on the target is preferably B=500 to 2,000 Gausses and especially B=800 to 1,500 Gausses. The higher the magnetic flux density on the target, the preferable. If the magnetic flux density is increased to intensify the magnetic field strength thereby achieving such an electrode structure as to confine electrons in the vicinity of the target, there is then an increase in the number of ions in the sputtering gas in the plasma, which impinge on the cathode target, resulting in an increase in the plasma density. The increase in the plasma density gives rise to an increase in the frequency of impingement of particles upon one another, so that a part of kinetic energy is lost, resulting in gentle deposition of sputtered particles onto the substrate. How to create a magnetic field on the target is not critical in the practice of the invention. However, it is preferable to locate a magnet on the back side of the target, and especially in a cooling area. Magnets creating such a magnetic field, for instance, include Fe-Nd-B, Sm-Co, ferrite, and alnico magnets, among which the Fe-Nd-B, and Sm-Co magnets are most preferred because high magnetic flux densities are obtainable.

Bias voltage, i.e., voltage between the target and the substrate (bias electrodes) is in the range of preferably 100 to 300 V and especially 150 to 250 V. Too high a bias voltage tends to increase the acceleration of particles and, hence, cause damage to the electrode layer. At too low a bias voltage it is difficult to obtain the aforesaid effect because plasma discharge cannot be maintained or the plasma density drops.

Preferably, both the magnetic field strength and the bias voltage are adjusted to the optimum values in the aforesaid ranges while the environment in which the sputtering system is used, the scale of the system, etc. are taken into account.

Power for operating the DC sputtering system is in the range of preferably 0.1 to 10 W/cm$^2$ and especially 0.5 to 7 W/cm$^2$. The film forming rate is in the range of preferably 5 to 100 nm/min. and especially 10 to 50 nm/min., although varying depending on what conditions the system is operated in, e.g., the type of the magnet used. Sputtering is carried out at a gas pressure usually applied to electrode formation, e.g., 0.1 to 0.5 Pa and a substrate-to-target distance of 4 to 10 cm.

For the sputtering gas, use is made of inert gases employed with ordinary sputtering systems. For reactive sputtering, reactive gases such as $N_2$, $H_2$, $O_2$, $C_2H_4$ and $NH_3$ may be used in addition to these gases. However, preference is given to any one of Ar, Kr and Xe or a mixed gas containing at least one of these gases. These gases are preferable due to their inertness and relatively large atomic weight. It is particularly preferable to use Ar, Kr, and Xe alone. When the Ar, Kr or Xe gas is used, sputtered atoms impinge repeatedly on the gas in the process of reaching the substrate, and arrive at the substrate while their kinetic energy is diminished. Such sputtered atoms with diminished kinetic energy cause less physical damage to an organic EL structure. It is also preferable to use a mixed gas containing at least one of Ar, Kr and Xe. When such a mixed gas is used, Ar, Kr, and Xe acts as a main sputtering gas provided that the sum of partial pressures of Ar, Kr and Xe is at least 50%. By using at least one of Ar, Kr and Xe in combination with any desired gas, it is thus possible to carry out reactive sputtering while the advantages of the invention are maintained.

According to the present invention, the sealing film can in itself impart a sufficient protecting and sealing effect to an organic EL device. If required, an additional protective film may be formed on the sealing film. The protective film may be formed of either an inorganic material such as $SiO_x$ or an organic material such as Teflon. The protective film may be either transparent or opaque, and has a thickness of the order of 50 to 1,200 nm. The protective film may be formed either by the aforesaid reactive sputtering process or conventional processes such as general sputtering, evaporation or like other processes.

In the practice of the invention, it is preferred to form a sealing layer on the device in order to prevent oxidation of the organic and electrode layers. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic layers provided in the EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the hole injecting electrode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about $\frac{1}{10}$ times to about 10 times as large as, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit on thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, for instance, quinacridone, rubrene, and styryl dyes. Use may also be made of quinoline derivatives such as metal complex dyes containing 8-quinolinol or its derivative as ligands, for instance, tris(8-quinolinolato) aluminum, tetraphenylbutadiene, anthracene, perylene, coronene, and 12-phthaloperinone derivatives. Use may further be made of phenyanthracene derivatives disclosed in JP-A 6-110569, and tetraarylethene derivatives disclosed in JP-A 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro8-quinolinolato)calcium, 5,7-dichloro-8-quinolinolato-aluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis (2-methyl-8-quinolinolato)(2,3-dimethylphenolato) aluminum (III), bis(2-methyl-8-quinolinolato)(2,6-dimethylphenolato)aluminum (III), bis(2-methyl-8-quinolinolato)(3,4-dimethylphenolato) aluminum (III), bis (2-methyl-8-quinolinolato)(3,5-dimethyl-phenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethylphenolato)aluminum (III), bis(2-methyl-8-quinolinolato) (2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato) (m-phenylphenolato) aluminum (III), bis(2,4-dimethyl-8-quinolinolato)(3,5-dimethylphenolato)aluminum (III), bis (2,4-dimethyl-gquinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato)aluminum (III), and bis(2-methyl6-trifluoromethyl-8-quinolinolato)(2-naphtholato)aluminum (III).

Besides, use may be made of bis(2-methyl-8-quinolinolato)aluminum (III)-g-oxo-bis(2-methyl-8-quinolinolato) aluminum (III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum (III)-μ-oxo-bis(4-ethyl-2-methyl-8-quinolinolato)aluminum (III), bis(2-methyl-4-methoxyquinolinolato)aluminum (III)-μ-oxo-bis(2-methyl-4-methoxyquinolinolato)aluminum (III), bis(5-cyano-2-methyl-8-quinolinolato) aluminum (III)-μ-oxo-bis(5-cyano-2-methyl-8-quinolinolato)aluminum (III), bis(2-methyl-5-trifluoromethyl-8-quinolinolato)aluminum (III)-μ-oxo-bis (2methyl-5-trifluoromethyl-8-quinolinolato)aluminum (III), etc.

Other preferable host substances include phenylanthracene derivatives disclosed in JP-A 6-110569, tetraarylethene derivatives disclosed in JP-A 6-114456, etc.

In the practice of the invention, the light emitting layer may also serve as an electron injecting and transporting layer. In this case, it is preferable to use tris(8-quinolinolato) aluminum or the like. These fluorescent materials may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$) . It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring, as already mentioned.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed contiguous to the hole injecting electrode (ITO, etc.). It is also preferred to use a compound having good thin film forming ability at the hole injecting electrode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer as previously mentioned. Like the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the substrate material, transparent or translucent materials such as glass, quartz and resins are used when the emitted light is taken out of the substrate side. The substrate may be provided with a color filter film, fluorescent material-containing color conversion film or dielectric reflecting film for controlling the color of light emission. When the device has a inverted multilayer structure as mentioned above, the substrate used may be transparent or opaque. For the opaque substrate, a ceramic material or the like may be used.

For the color filter film, a color filter employed with liquid crystal display devices may be used. However, it is prefer-able to control the properties of the color filter in conformity to the light emitted from the organic EL device, thereby optimizing the efficiency of taking out light emission and color purity.

By using a color filter capable of cutting off extraneous light of such wavelength as absorbed by the EL device material or the fluorescent color conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of up to $10^{-4}$ Pa. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and appearance of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some examples and comparative examples.

Example 1

Using an RF sputtering process with a target obtained by doping $In_2O_3$ with 5 wt % of $SnO_2$, an ITO transparent electrode thin film was formed on a glass substrate at a film forming rate of 5 nm/min. to a thickness of 120 nm, followed by patterning. The electrode was ultrasonically washed with neutral detergent, acetone, and ethanol, and then pulled up from boiling ethanol, followed by drying. This transparent electrode was cleaned on its surface with $UV/O_3$. Following this, the electrode was fixed to a substrate holder in a vacuum evaporation system, which was evacuated to a vacuum of $1 \times 10^{-4}$ Pa or lower.

With the vacuum kept, N,N'-diphenyl-N,N'-m-tolyl-4,4'-diamino-1,1'-biphenyl (TPD) was evaporated at a deposition rate of 0.2 nm/sec. to a thickness of 55 nm to form a hole injecting and transporting layer.

With the vacuum still kept, tris(8-quinolinolato) aluminum ($Alq^3$) was evaporated at a deposition rate of 0.2 nm/sec. to a thickness of 50 nm to form an electron injecting/transporting and light emitting layer.

Then, the obtained multilayer structure was transferred from the vacuum evaporation system to a sputtering system wherein Ag.Mg (Mg: 5 at %) was used as a target to form an electron injecting electrode at a film forming rate of 10 nm/min. to a thickness of 150 nm by means of a sputtering process. For the sputtering gas, Ar was used at a flow rate of 50 sccm. Input power was 50 W and the substrate-to-target distance was 8 cm.

Then, a reactive gas or $O_2$ was introduced in the sputtering system at a flow rate of 2 sccm for continuous sputtering of an oxide of the Ag.Mg to a thickness of 150 nm, thereby forming a sealing film. In this way, an organic EL structure was obtained. The sealing film was found to contain 20 at % of oxygen in the Ag.Mg. Further, a glass sealing plate was bonded at a given height on the substrate with the organic EL structure formed, thereby obtaining an organic EL device.

DC voltage was applied across the organic EL device to continuously drive the device at a constant current density of 10 mA/cm². In the initial stage, the device was found to emit green light of 250 cd/m² (light emission maximum wavelength λmax=520 nm) at 8.5 V. Even after the device was driven over 5,000 hours, nowhere in the device were dark spots of 100 μm or greater found at all. Even after that, the device continued to emit light in a stable manner without any current leakage.

In this example, the work function of the Ag.Mg was 3.8 eV.

Example 2

An organic EL device was obtained following Example 1 with the exception that instead of the reactive gas $O_2$, $N_2$ was used at a flow rate of 2 sccm. The sealing film was found to contain 15 at % of nitrogen in the Ag.Mg.

DC voltage was applied across the organic EL device to drive the device in the same manner as in Example 1. Light emission substantially similar to that in Example 1 was observed. Even after the device was driven over 5,000 hours, nowhere in the device were dark spots of 100 μm or greater found at all. Even after that, the device continued to emit light in a stable manner without any current leakage.

Example 3

An organic EL device was obtained following Example 1 with the exception that instead of the reactive gas $O_2$, $CH_4$ was used at a flow rate of 2 sccm. The sealing film was found to contain 20 at % of carbon and 1 at % of hydrogen in the Ag.Mg.

DC voltage was applied across the organic EL device to drive the device in the same manner as in Example 1. Light emission substantially similar to that in Example 1 was observed. Even after the device was driven over 5,000 hours, nowhere in the device were dark spots of 100 μm or greater found at all. Even after that, the device continued to emit light in a stable manner without any current leakage.

Example 4

Following Example 1, an electron injecting electrode of 50 nm in thickness was formed with the exception that instead of the Ag.Mg target, an Al.Li (Li: 10 at %) target was used for the formation of the electron injecting electrode. After the target was changed over to an Al target, a reactive gas or $N_2$ was introduced at a flow rate of 2 sccm to continuously sputter a nitride of aluminum to a thickness of 150 nm, thereby forming a sealing film. In this way, an organic EL device was obtained. The sealing film was found to contain 20 at % of nitrogen in the aluminum.

DC voltage was applied across the organic EL device to continuously drive the device at a constant current density of 10 mA/cm². In the initial stage, the device was found to emit green light of 350 cd/m² (light emission maximum wavelength λmax=520 nm) at 8 V. Even after the device was driven over 5,000 hours, nowhere in the device were dark spots of 100 μm or greater found at all. Even after that, the device continued to emit light in a stable manner without any current leakage.

Example 5

An organic EL device was obtained following Example 4 with the exception that instead of the reactive gas $N_2$, $O_2$ was used at a flow rate of 2 sccm. The sealing film was found to contain 30 at % of oxygen in the aluminum.

DC voltage was applied across the organic EL device to drive the device in the same manner as in Example 1. Light emission substantially similar to that in Example 1 was observed. Even after the device was driven over 5,000 hours, nowhere in the device were dark spots of 100 μm or greater found at all. Even after that, the device continued to emit light in a stable manner without any current leakage.

Example 6

Following Example 4, an electron injecting electrode of 50 nm in thickness was formed. Then, the target was changed over to an Al target to form an auxiliary electrode of 100 nm in thickness. After this, a sealing film was formed as in Example 4 to obtain an organic EL device.

DC voltage was applied across the organic EL device to continuously drive the device at a constant current density of 10 mA/cm². In the initial stage, the device was found to emit green light of 360 cd/m² (light emission maximum wavelength λmax=520 nm) at 8.1 V. Even after the device was driven over 5,000 hours, nowhere in the device were dark spots of 100 μm or greater found at all. Even after that, the device continued to emit light in a stable manner without any current leakage.

Example 7

An organic EL device was obtained following Example 4 with the exception that instead of the reactive gas $N_2$, $O_2$ was used at a flow rate of 2 sccm. The sealing film was found to contain 30 at % of oxygen in the aluminum.

DC voltage was applied across the organic EL device to drive the device in the same manner as in Example 1. Light emission substantially similar to that in Example 1 was observed. Even after the device was driven over 5,000 hours, nowhere in the device were dark spots of 100 μm or greater found at all. Even after that, the device continued to emit light in a stable manner without any current leakage.

For the reactive gas, $CH_4$ was used to form a sealing film as mentioned above, thereby obtaining an organic EL device. Consequently, it was found that similar effects as mentioned above are obtained.

Comparative Example 1

An organic EL structure was obtained following Example 1 with the exception that the Ag.Mg electron injecting electrode was immediately prepared without introducing any reactive gas after the formation of the electron injecting electrode, thereby forming a sealing film. A protective layer made up of Teflon was then deposited by evaporation on the organic EL structure at a deposition rate of 0.2 nm/sec. to a thickness of 100 nm. Finally, a glass plate was sealed on the protective layer for glass sealing purposes, thereby obtaining an organic EL device.

DC voltage was applied across the organic EL device to drive the device in the same manner as in Example 1. Light emission substantially similar to that in Example 1 was observed. After the lapse of 4,000 hours, however, the appearance and growth of dark spots of 100 μm or greater were observed.

INDUSTRIAL APPLICABILITY

The present invention can provide an organic EL device having a sealing film which can be relatively easily formed continuously from an electron injecting electrode without recourse to any dedicated equipment for sealing films, and have an improved sealing effect, and a process of producing such an organic EL device.

What we claim is:

1. An organic EL device comprising at least a substrate and a hole injecting electrode, a light emitting layer and an electron injecting electrode containing a constituting material having a work function of up to 4 eV formed on said substrate, wherein:

said electron injecting electrode has a sealing film on a side thereof opposite to said substrate, said sealing film containing one or two or more of an oxide, a nitride and a carbide of a constituting material for said electron injecting electrode; and wherein said sealing film contains oxygen, nitrogen and carbon in amounts of 1 to 60 at % calculated as 0.1 to 30 at % calculated as N and 1 to 20 at % calculated as C, respectively.

2. An organic EL device at least comprising a substrate and a hole injecting electrode, a light emitting layer and an electron injecting electrode containing a constituting material having a work function of up to 4 eV formed on said substrate, wherein:

said electron injecting electrode has an auxiliary electrode thereon, said auxiliary electrode having a sealing film on a side thereof opposite to said substrate, and said sealing film containing one or two or more of an oxide, a nitride and a carbide of a constituting material for said auxiliary electrode; and wherein said sealing film contains oxygen nitrogen and carbon in amounts of 1 to 60 at % calculated as 0.1 to 30 at % calculated as N and 1 to 20 at % calculated as C, respectively.

3. A process of producing an organic EL device according to claim 1, which comprise steps of forming an electron injecting electrode having a work function of up to 4 eV by a sputtering technique, and then sputtering a constituting material for said electron injecting electrode while a gas containing one or two or more of oxygen, nitrogen and carbon is introduced as a reactive gas to form a sealing film.

4. A process of producing an organic EL device according to claim 2, which comprises steps of:

forming an electron injecting electrode containing a constituting material having a work function of up to 4 eV by a sputtering technique, forming an auxiliary electrode by a sputtering technique after formation of said electron injecting electrode, and sputtering a constituting material for said auxiliary electrode while a gas containing one or two or more of oxygen, nitrogen and carbon is introduced as a reactive gas to form a sealing film.

* * * * *